(12) United States Patent
Delchmann et al.

(10) Patent No.: US 10,923,251 B2
(45) Date of Patent: Feb. 16, 2021

(54) ARRANGEMENT HAVING A COAXIAL RESISTOR

(71) Applicant: SIEMENS AKTIENGESELLSCHAFT, Munich (DE)

(72) Inventors: Wilhelm Delchmann, Hessdorf (DE); Michael Hofstetter, Munich (DE); Andreas Philipp, Winkelhaid (DE); Michael Zorawik, Hallerndorf (DE)

(73) Assignee: Siemens Aktiengesellschaft, Munich (DE)

( * ) Notice: Subject to any disclaimer, the term of this patent is extended or adjusted under 35 U.S.C. 154(b) by 218 days.

(21) Appl. No.: 16/217,338

(22) Filed: Dec. 12, 2018

(65) Prior Publication Data

US 2019/0180893 A1 Jun. 13, 2019

(30) Foreign Application Priority Data

Dec. 12, 2017 (DE) ...................... 10 2017 222 479.7

(51) Int. Cl.
| | |
|---|---|
| *H01C 3/02* | (2006.01) |
| *H01C 1/02* | (2006.01) |
| *G01R 19/00* | (2006.01) |
| *G01R 15/22* | (2006.01) |
| *H01C 1/06* | (2006.01) |
| *H01C 1/14* | (2006.01) |
| *G01R 1/20* | (2006.01) |

(52) U.S. Cl.
CPC .............. *H01C 3/02* (2013.01); *G01R 1/203* (2013.01); *G01R 15/22* (2013.01); *G01R 19/0092* (2013.01); *H01C 1/02* (2013.01); *H01C 1/06* (2013.01); *H01C 1/14* (2013.01)

(58) Field of Classification Search
CPC ... H01C 3/02; H01C 1/02; H01C 1/06; H01C 1/14; G01R 1/203; G01R 15/22; G01R 19/0092

See application file for complete search history.

(56) References Cited

U.S. PATENT DOCUMENTS

| | | | | |
|---|---|---|---|---|
| 2,755,454 | A | * 7/1956 | Rogoff | ................. H01R 11/281 |
| | | | | 439/769 |
| 3,527,875 | A | * 9/1970 | Saxon | .................... H02G 5/002 |
| | | | | 174/73.1 |
| 3,889,042 | A | 6/1975 | Mears | |
| 4,322,710 | A | * 3/1982 | Carson | ..................... H01C 7/13 |
| | | | | 338/272 |

(Continued)

FOREIGN PATENT DOCUMENTS

| CN | 106950525 A | 7/2017 |
|---|---|---|
| DE | 19854436 A1 | 6/2000 |

(Continued)

*Primary Examiner* — Lee E Rodak
(74) *Attorney, Agent, or Firm* — Laurence Greenberg; Werner Stemer; Ralph Locher

(57) ABSTRACT

An arrangement has a coaxial resistor. The coaxial resistor is to be placed on an electrically conductive housing, and sensor lines of the coaxial resistor are to be guided through an interior of the coaxial resistor into the interior of the electrically conductive housing and to be connected to an electrical interface in the electrically conductive housing.

16 Claims, 5 Drawing Sheets

(56) References Cited

U.S. PATENT DOCUMENTS

| | | | | |
|---|---|---|---|---|
| 4,580,095 A | * | 4/1986 | De Vries | G01R 15/183 |
| | | | | 324/126 |
| 5,596,309 A | * | 1/1997 | Nabeshima | H01C 3/02 |
| | | | | 338/214 |
| 7,928,608 B1 | * | 4/2011 | Lyons | H01R 24/50 |
| | | | | 307/147 |
| 2009/0195348 A1 | * | 8/2009 | Smith | H01C 10/00 |
| | | | | 338/332 |
| 2012/0154104 A1 | * | 6/2012 | Hetzler | H01C 17/28 |
| | | | | 338/49 |
| 2017/0212148 A1 | | 7/2017 | Hetzler | |

FOREIGN PATENT DOCUMENTS

| | | |
|---|---|---|
| DE | 202005019484 U1 | 2/2006 |
| DE | 202010010152 U1 | 11/2010 |
| DE | 102014011593 A1 | 2/2016 |
| FR | 2044459 A5 | 2/1971 |
| FR | 2348498 A1 | 11/1977 |
| GB | 1424984 A | 2/1976 |
| JP | 2003315371 A | 11/2003 |
| WO | 2010088908 A1 | 8/2010 |
| WO | 2017068409 A1 | 4/2017 |

\* cited by examiner

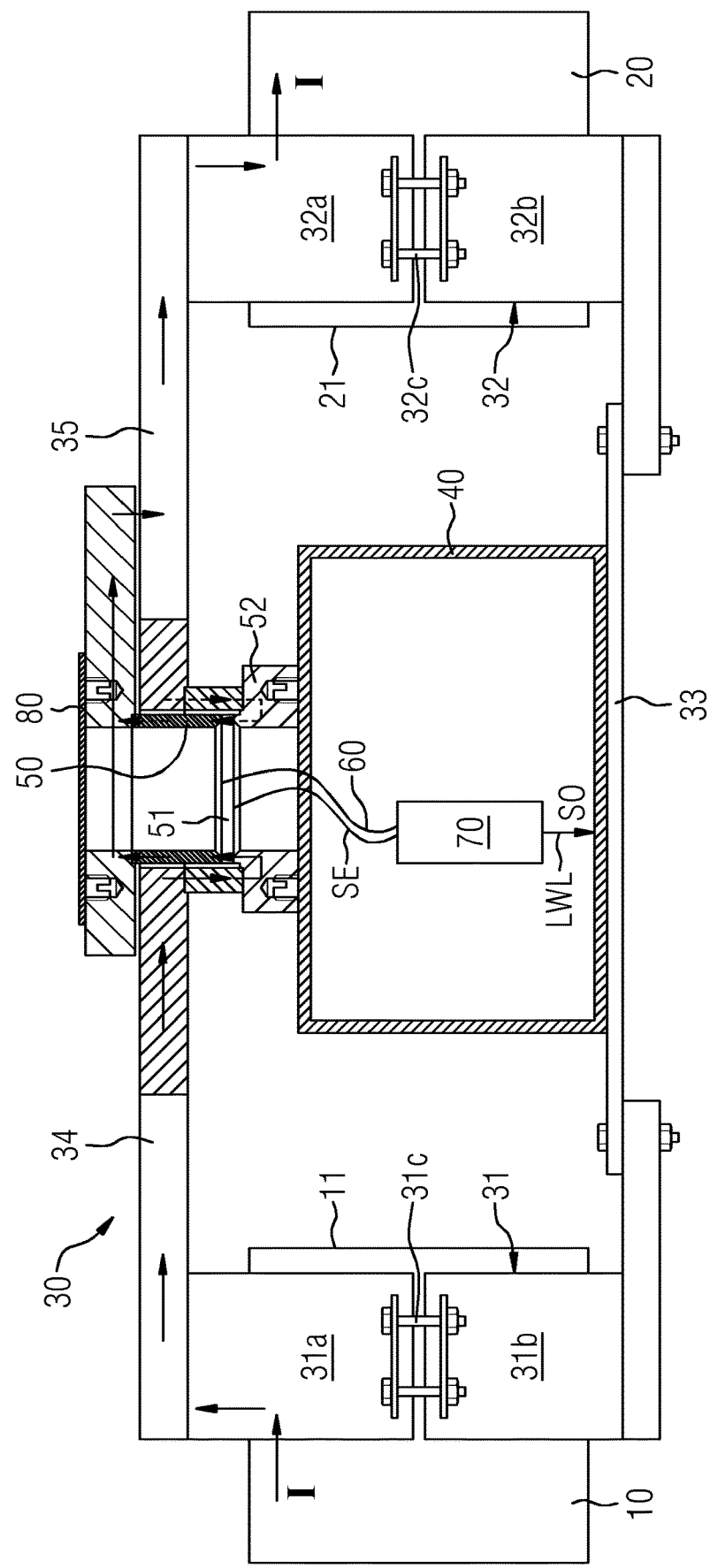

ARRANGEMENT HAVING A COAXIAL RESISTOR

CROSS-REFERENCE TO RELATED APPLICATION

This application claims the priority, under 35 U.S.C. § 119, of German application DE 10 2017 222 479.7, filed Dec. 12, 2017; the prior application is herewith incorporated by reference in its entirety.

BACKGROUND OF THE INVENTION

Field of the Invention

In high-voltage installations, in particular those for transmitting high-voltage direct current, the current is usually measured at different locations. In this case, the current may be a DC variable or an AC variable or a combination of both forms. In VSC-based installations for transmitting high-voltage direct current in particular, there is a high requirement imposed on the dynamic response of the measurement system since a measurement of high-frequency currents of up to 50 kHz is desirable. The problem is now that interference caused by electromagnetic fields of high field strength can be expected in the high-voltage installation.

An arrangement having a coaxial resistor is known, for example, from international patent disclosure WO 2017/068409. In the previously known arrangement, a resistor ring for generating an electrical measurement signal is arranged in the outer region of the coaxial resistor.

SUMMARY OF THE INVENTION

The invention is based on the object of specifying an arrangement having a coaxial resistor which makes it possible to generate measurement signals in a particularly interference-free manner.

This object is achieved, according to the invention, by means of an arrangement having the features according to the independent patent claim. Advantageous configurations of the arrangement according to the invention are stated in subclaims.

Accordingly, the invention provides for the coaxial resistor to be placed on an electrically conductive housing, and for sensor lines of the coaxial resistor to be guided through an interior of the coaxial resistor into the interior of the housing and to be connected to an electrical interface in the housing.

A significant advantage of the arrangement according to the invention can be seen in the fact that the sensor lines are guided in the inner region of the coaxial resistor, with the result that the sensor lines and therefore the measurement signals carried on the latter are shielded from external influences, in particular electromagnetic waves or radiation, by the coaxial resistor.

The electrical interface is preferably a measurement device if measured values are already intended to be generated in the housing. The measured values can be stored in the housing or output, for example. Output is preferably carried out optically, for example by one or more optical waveguides, since optical waveguides advantageously enable potential isolation between the electrical interface and a receiving device receiving the measured values from the latter.

Alternatively, it is considered to be advantageous if the electrical interface is merely an electro-optical converter which only converts the electrical measurement signal(s) into optical measurement signals as the output signal in the housing and outputs them to the outside by means of one or more optical waveguides.

With respect to the structure of the coaxial resistor, it is considered to be advantageous if the coaxial resistor has an outer waveguide and an inner waveguide which is arranged coaxially in the outer waveguide and is separated from the latter by a gap. The inner waveguide preferably has at least two ring segments, at least one of which is a resistor ring which is connected to the sensor lines or to at least two of the sensor lines.

It is particularly advantageous if the inner waveguide has at least three ring segments, wherein one of these is a waveguide section close to the housing, one is a waveguide section remote from the housing and one is a resistor ring between the waveguide section remote from the housing and the waveguide section close to the housing.

Based on their outer contour and their inner contour, the ring segments preferably have a circular cross section, but other outer contours and inner contours (for example elliptical, square, etc.) are alternatively also conceivable. However, it is advantageous if the inner contour is configured such that the sensor lines can be guided through the inner contour region.

It is also advantageous to provide two or more resistor rings in the inner waveguide for the purpose of generating a plurality of measurement signals. In this configuration too, the sensor lines are guided through the interior of the coaxial resistor into the interior of the housing.

With respect to the mechanical structure, it is advantageous if an inner section of a supporting element of the coaxial resistor forms a ring segment of the inner waveguide, in particular the waveguide section close to the housing, and an outer section of the supporting element supports an outer ring element of the outer waveguide.

The coaxial resistor is preferably flanged onto the housing. It is advantageous if a section of the supporting element forms a section, in particular a flange section, which is screwed, in particular flanged, onto the housing.

One or more shielding elements, in particular one or more shielding plates, preferably form, together with the conductive housing and the coaxial resistor, a Faraday cage at least also for the resistor ring, the sensor lines and/or the electrical interface.

The coaxial resistor and the housing are preferably held, by a fastening device, between a first conductor end of a first conductor of an energy transmission line and a second conductor end of a second conductor of the same energy transmission line, which second conductor end is opposite the first conductor end. The fastening device is fastened using a first clamping device at the first conductor end and using a second clamping device at the second conductor end.

The fastening device is preferably also used to conduct current between the two conductor ends.

The first clamping device preferably has a first clamping element and a first mating clamping element which surround the first conductor end and clamp it between them, and the second clamping device preferably has a second clamping element and a second mating clamping element which surround the second conductor end and clamp it between them.

The first and second conductors are preferably each conductor tubes which are arranged in a coaxial manner with respect to one another in the region of the first and second conductor ends.

With respect to the fastening, it is also considered to be advantageous if the fastening device has a non-conductive holding element on which the housing is placed. The coaxial resistor is preferably held by the housing held by the fastening device. The coaxial resistor is preferably fitted to the housing on that side of the housing which faces away from the holding element.

It is also considered to be advantageous if the fastening device is connected to one electrical connection of the coaxial resistor using a first connecting rail and is connected to the other electrical connection of the coaxial resistor using a second connecting rail, and the two connecting rails of the fastening device hold the coaxial resistor and the coaxial resistor in turn holds the housing. In this configuration, the non-conductive holding element can, but need not, be dispensed with.

An electrical shielding device for a corona discharge preferably externally shields the coaxial resistor and the housing.

The electrical shielding device preferably has an elliptical or round cross section.

The longitudinal axis of the electrical shielding device is preferably arranged in a coaxial manner with respect to the two conductor tubes, at least in the region of the conductor ends which are opposite one another.

Other features which are considered as characteristic for the invention are set forth in the appended claims.

Although the invention is illustrated and described herein as embodied in an arrangement having a coaxial resistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 5 is a sectional view of an exemplary embodiment of an arrangement according to the invention in which a housing is held by a coaxial resistor which is in turn held by load-bearing connecting rails of a fastening device.

DETAILED DESCRIPTION OF THE INVENTION

In the figures, the same reference signs are always used for identical or comparable components for the sake of clarity.

Figure 1:
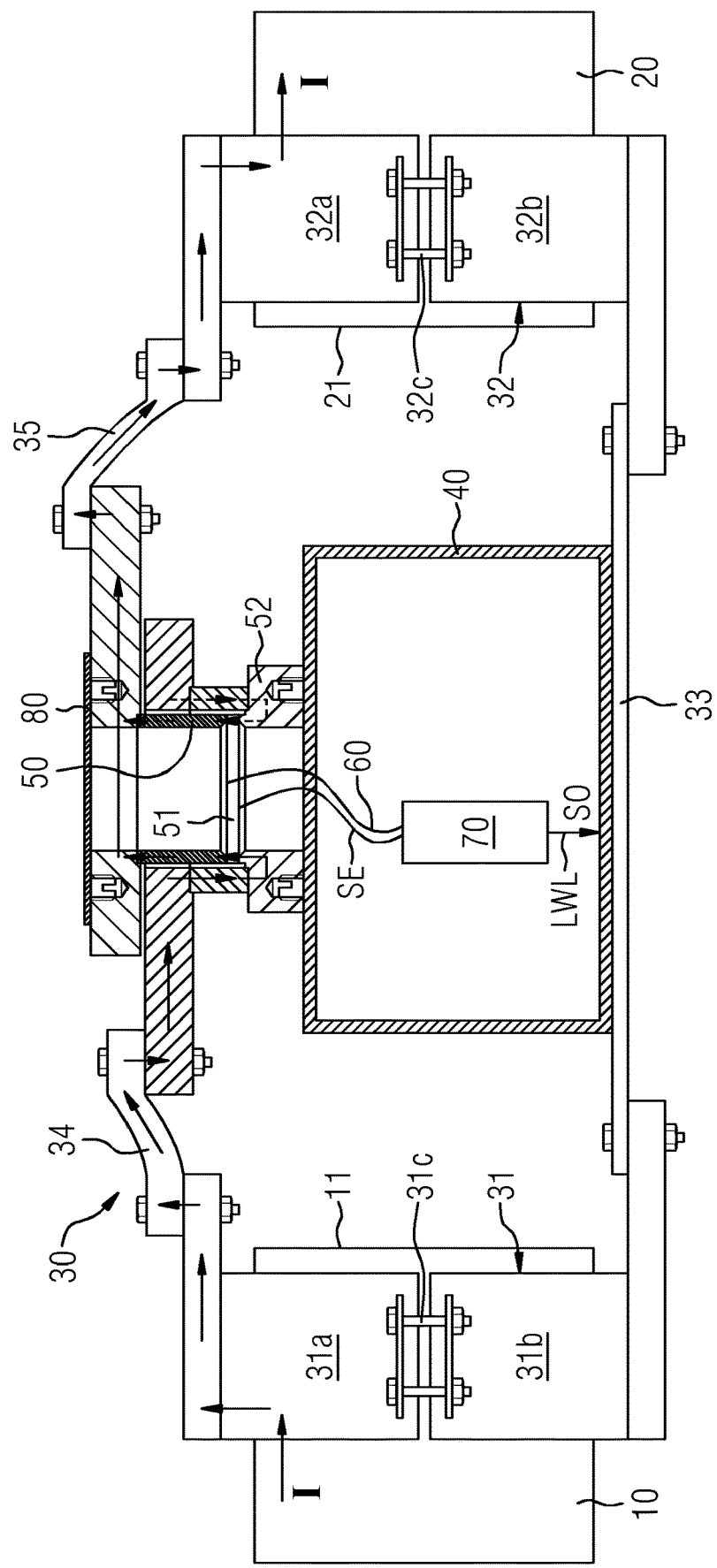
FIG. 1 is a diagrammatic, sectional view of an exemplary embodiment of an arrangement according to the invention in which a coaxial resistor and a housing are held by a holding element of a fastening device.

Referring now to the figures of the drawings in detail and first, particularly to FIG. 1 thereof, there is shown a first conductor tube 10, a first conductor end 11 of which is at a distance from a second conductor end 21 of a second conductor tube 20. The two conductor tubes 10 and 20 are preferably arranged in a coaxial manner with respect to one another and are therefore aligned.

A fastening device 30 holds an electrically conductive housing 40 with a coaxial resistor 50 fitted to the latter between the two conductor ends 11 and 21 of the two conductor tubes 10 and 20. The coaxial resistor 50 has a supporting element 52 which is used for connection on the housing 40.

The coaxial resistor 50 contains a resistor ring 51 which is connected, by means of sensor lines 60, to an electrical interface 70 in the housing interior of the electrically conductive housing 40. The sensor lines 60 are guided through a hollow interior inside the coaxial resistor 50 and are therefore shielded from external effects (for example electrical or magnetic fields) by the coaxial resistor 50 and the housing 40.

The electrical interface 70 may be a measurement device which measures an electrical measurement signal SE from the sensor lines 60 and forms corresponding measured values. The measured values can be stored in the measurement device or can be output to the outside, for example using an optical output signal SO. The optical output signal SO is preferably passed, via an optical waveguide LWL made of a dielectric material, to a receiver device which is not illustrated in FIG. 1 and is arranged outside the housing 40.

Alternatively, the electrical interface 70 may be an electro-optical converter which only converts the electrical measurement signal SE into the optical output signal SO and outputs the latter via the optical waveguide LWL.

For fastening at the first conductor end 11 of the first conductor tube 10, the fastening device 30 has a first clamping device 31 which contains a first clamping element 31a and an opposite first mating clamping element 31b. The clamping element 31a and the mating clamping element 31b may be formed by clamps which are screwed to one another by a clamp-type screw connection 31c.

For connection to the second conductor end 21 of the second conductor tube 20, the fastening device 30 has a second clamping device 32 which contains a second clamping element 32a and a second mating clamping element 32b. The second clamping element 32a and the second mating clamping element 32b are preferably formed by clamps which are screwed to one another by means of a clamp—type screw connection 32c.

The two clamping devices 31a and 32a may be structurally identical, for example.

In the exemplary embodiment according to FIG. 1, the housing 40 and therefore the coaxial resistor 50 are held by the non-conductive holding element 33 of the fastening device 30. Connecting rails 34 and 35 are used to electrically connect the coaxial resistor 50 to the two conductor tubes 10 and 20. The connecting rails 34 and 35 need only be suitable for conducting current and do not need to have any mechanical bearing capacity for holding or carrying the coaxial resistor 50 or the housing 40 since the last-mentioned components are carried by the holding element 33. With a view to absorbing mechanical stresses and the like, it is considered to be advantageous if the connecting rails 34 and 35 are mechanically flexible.

Figure 2:
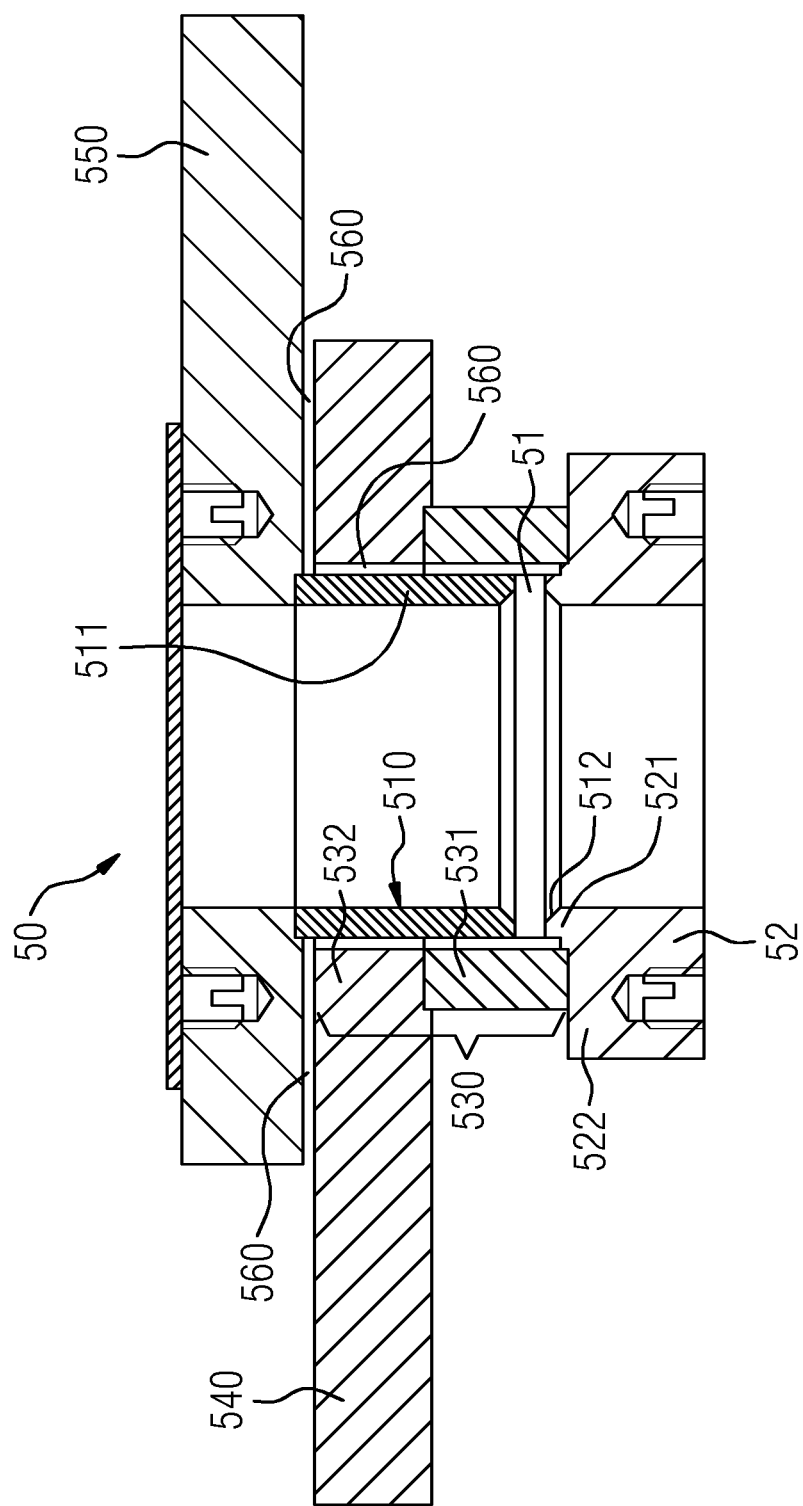
FIG. 2 is a sectional view of a structure of the coaxial resistor of the arrangement according to FIG. 1 more specifically in detail.

FIG. 2 shows the coaxial resistor 50 of the arrangement according to FIG. 1 more specifically in detail. It can be seen that the coaxial resistor 50 has an inner waveguide 510 which, in the exemplary embodiment according to FIG. 1, is formed by a waveguide section 511 remote from the housing, the resistor ring 51 and a waveguide section 512 close to the housing.

The waveguide section 511 remote from the housing is preferably formed by a metal ring.

The waveguide section 512 close to the housing is preferably formed by a protruding inner section 521 of the supporting element 52 which is used to fasten, in particular screw, the coaxial resistor 50 onto the housing 40 according to FIG. 1.

An outer section 522 of the supporting element 52 is used to support an outer ring element 531 which, together with an end section 532 of a connecting element 540 of the coaxial resistor 50 on the left in FIG. 2, forms an outer waveguide 530 of the coaxial resistor 50. The supporting element 52 is therefore used both to support the outer waveguide 530 and for the electrical connection between the outer waveguide 530 and the inner waveguide 510.

In order to avoid a direct flow of current between the connecting element 540 on the left in FIG. 2 and a connecting element 550 of the coaxial resistor 50 on the right in FIG. 2, a gap 560 (made of air or a non-conductive material) is provided between the two connecting elements 540 and 550, which gap also extends between the outer waveguide 530 and the inner waveguide 510 and therefore electrically isolates the outer waveguide 530 from the inner waveguide 510. The gap 560 ensures that a current I flowing through the coaxial resistor 50 must always flow through the resistor ring 51 and cannot pass or circumvent the latter.

Figure 3:
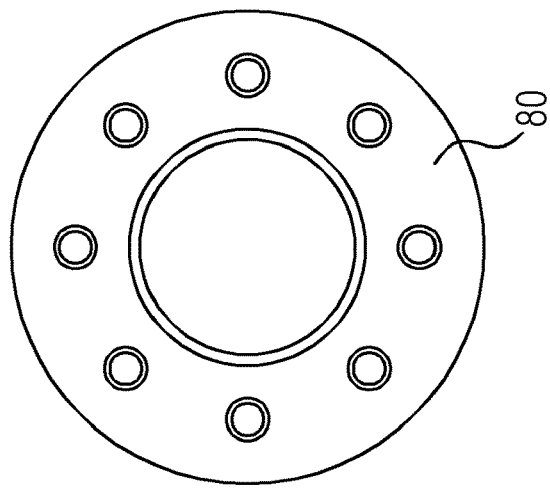
FIG. 3 is a top plan view of an exemplary embodiment of a shielding plate which can be used to form a Faraday cage in the arrangement according to FIG. 1.

FIG. 3 shows the plan view of an exemplary embodiment of a shielding plate 80 which can also be seen in FIG. 1, forms a shielding element and, together with the coaxial resistor 50 and the housing 40, is used to form a Faraday cage FK.

Figure 4:
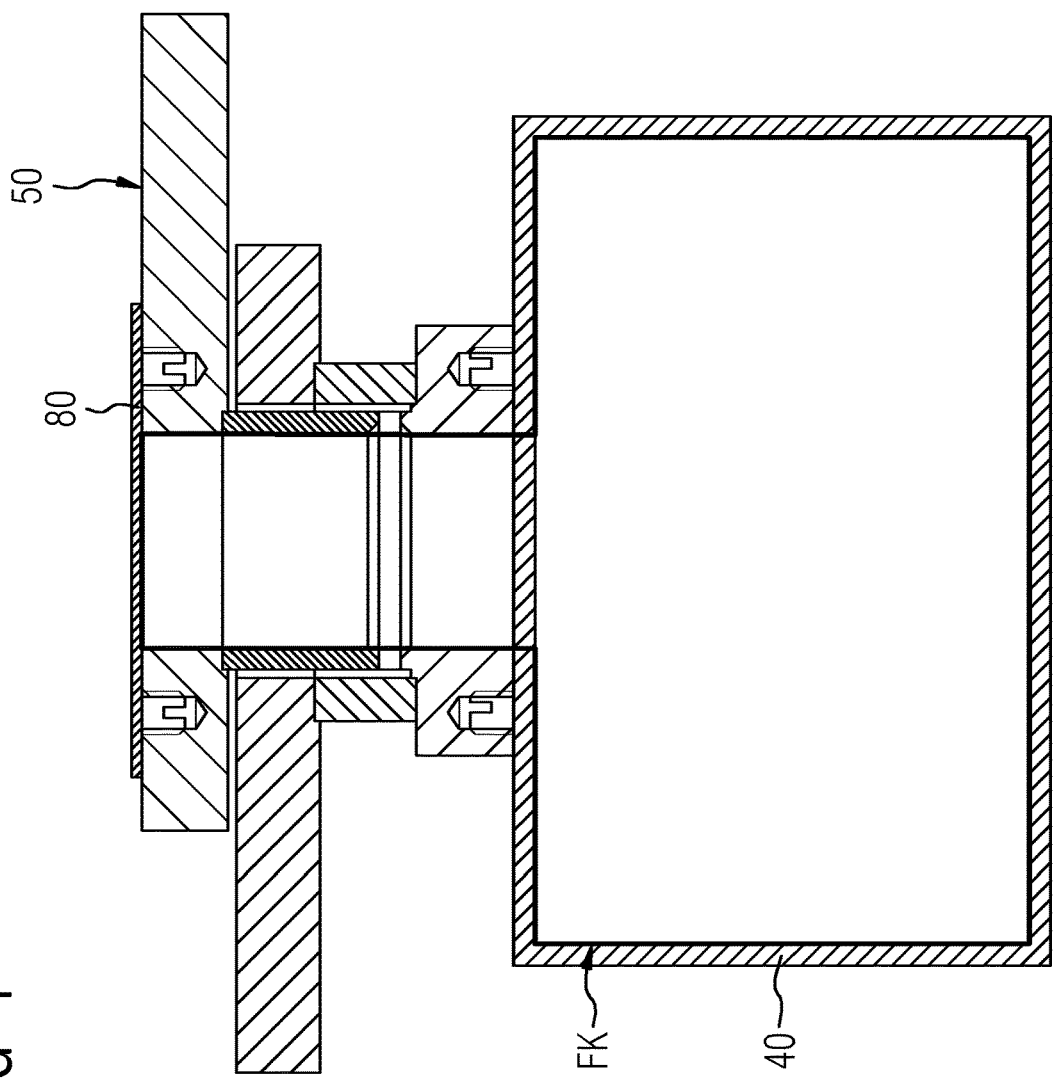
FIG. 4 is a cross-sectional view of the arrangement with the shielding plate according to FIG. 3.

FIG. 4 shows a cross section of the shielding plate 80 after mounting on the connecting element 550 of the coaxial resistor 50. It can be seen that the shielding plate 80 closes the inner cavity of the coaxial resistor 50 toward the top, with the result that the inner cavity of the coaxial resistor 50, together with the housing interior of the housing 40, forms a Faraday cage FK which is electromagnetically shielded to the outside.

FIG. 5 shows another exemplary embodiment of an arrangement having a coaxial resistor 50 and a housing 40 which are mounted together between the conductor ends 11 and 21 of two conductor tubes 10 and 20. A fastening device 30 which—in contrast to the exemplary embodiment according to FIG. 1—does not have a non-conductive holding element 33 for holding the housing 40 is used to hold the housing 40 and the coaxial resistor 50. Instead, the coaxial resistor 50 and the housing 40 are held solely by the connecting rails 34 and 35 of the fastening device 30 which—in contrast to the exemplary embodiment according to FIG. 1—are not flexible, but rather are rigid and weight-bearing and therefore alone are able to hold both the coaxial resistor 50 and the housing 40 between the two conductor ends 11 and 21 of the two conductor tubes 10 and 20.

Moreover, the explanations above in connection with FIGS. 1 and 4 accordingly apply to the exemplary embodiment according to FIG. 5.

Figure 6:
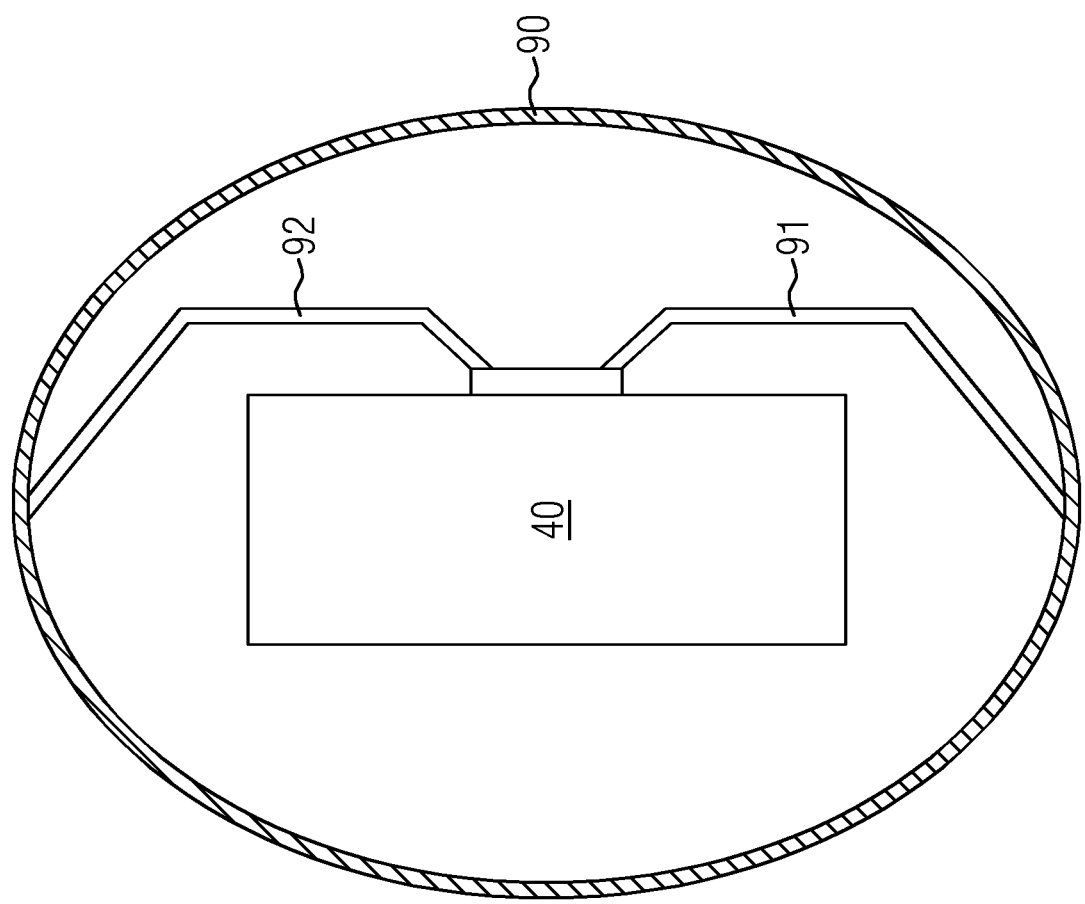
FIG. 6 is an illustration showing an exemplary embodiment of an electrical shielding device which can be used to shield the housing and the coaxial conductor in the arrangements according to FIGS. 1 and 5.

FIG. 6 shows an exemplary embodiment of a shielding device 90 which, seen in cross section, is elliptical or at least approximately cigar-shaped and technically forms a "corona cigar" for electromagnetically shielding the region between the two conductor ends 11 and 21. The corona cigar can be fitted to the housing 40, for example, by two supporting arms 91 and 92 in the arrangements according to FIGS. 1 and 5. Alternatively, it is possible to also fit the corona cigar to one of the two clamping devices 31 or 32 of the fastening device 30.

Although the invention has been described and illustrated more specifically in detail by means of preferred exemplary embodiments, the invention is not restricted by the disclosed examples and other variations can be derived therefrom by a person skilled in the art without departing from the scope of protection of the invention.

The following is a summary list of reference numerals and the corresponding structure used in the above description of the invention:

10 Conductor tube
11 Conductor end
20 Conductor tube
21 Conductor end
30 Fastening device
31 Clamping device
31a Clamping element
31b Mating clamping element
31c Clamp-type screw connection
32 Clamping device
32a Clamping element
32b Mating clamping element
32c Clamp-type screw connection
33 Holding element
34 Connecting rail
35 Connecting rail
40 Housing
50 Coaxial resistor
51 Resistor ring
52 Supporting element
60 Sensor lines
70 Interface
80 Shielding plate
90 Shielding device
91 Supporting arm
92 Supporting arm
510 Waveguide
511 Waveguide section
512 Waveguide section
521 Section
522 Section
530 Waveguide
531 Ring element
532 End section
540 Connecting element
550 Connecting element
560 Gap
FK Faraday cage
I Current
LWW Optical waveguide
SE Electrical measurement signal
SO Optical output signal

The invention claimed is:

1. A configuration, comprising:
an electrically conductive housing having an interior;
an electrical interface disposed in said electrically conductive housing; and
a coaxial resistor disposed on said electrically conductive housing, said coaxial resistor having sensor lines being guided through an interior of said coaxial resistor into said interior of said electrically conductive housing and are connected to said electrical interface, said coaxial resistor having an outer waveguide and an inner waveguide disposed coaxially in said outer waveguide and being separated from said outer waveguide by a gap, said inner waveguide having at least two ring segments, at least one of said at least two ring segments is a resistor ring which is connected to said sensor lines or to at least two of said sensor lines.

2. The configuration according to claim 1, wherein said inner waveguide has at least three said ring segments, wherein one of said at least three ring segments is a first waveguide section close to said electrically conductive housing, one of said at least three ring segments is a second waveguide section remote from said electrically conductive housing and one of said at least three ring segments is a resistor ring between said second waveguide section remote from said electrically conductive housing and said first waveguide section close to said electrically conductive housing.

3. The configuration according to claim 2, wherein:
said coaxial resistor has a supporting element with an inner section forming a ring segment of said inner waveguide; and
said supporting element has an outer section which supports an outer ring element of said outer waveguide.

4. The configuration according to claim 3, wherein said supporting element has a section which forms a flange section which is flanged onto said electrically conductive housing.

5. The configuration according to claim 3, wherein said supporting element with said inner section forms said first waveguide section close to said electrically conductive housing.

6. The configuration according to claim 1, wherein said coaxial resistor is flanged onto said electrically conductive housing.

7. The configuration according to claim 1, further comprising at least one shielding element which forms together with said electrically conductive housing and said coaxial resistor, a Faraday cage at least also for said resistor ring, said sensor lines and/or said electrical interface.

8. The configuration according to claim 7, wherein said at least one shielding element is a shielding plate.

9. The configuration according the claim 1, further comprising:
a first clamping device;
a second clamping device; and
a fastening device, said coaxial resistor and said electrically conductive housing are held, by means of said fastening device, between a first conductor end of a first conductor of an energy transmission line and a second conductor end of a second conductor of the energy transmission line, wherein the second conductor end is opposite the first conductor end, said fastening device is fastened using said first clamping device at the first conductor end and using said second clamping device at the second conductor end.

10. The configuration according to claim 9, wherein:
said first clamping device has a first clamping element and a first mating clamping element which surround the first conductor end and clamp it between them; and
said second clamping device has a second clamping element and a second mating clamping element which surround the second conductor end and clamp it between them.

11. The configuration according to claim 9, wherein the first and second conductors are each conductor tubes which are disposed in a coaxial manner with respect to one another in a region of the first and second conductor ends.

12. The configuration according to claim 9, wherein:
said fastening device has a non-conductive holding element on which said electrically conductive housing is placed; and
said coaxial resistor is held between the first and second conductor ends by said electrically conductive housing held by said fastening device.

13. The configuration according to claim 9, wherein:
said coaxial resistor has electrical connections;
said fastening device has a first connecting rail connected to a first of said electrical connections of said coaxial resistor and is connected to a second of said electrical connections of said coaxial resistor using a second connecting rail; and
said first and second connecting rails of said fastening device hold said coaxial resistor and said coaxial resistor holds said electrically conducting housing.

14. The configuration according to claim 9, further comprising an electrical shielding device for corona discharge and externally shields said coaxial resistor and said electrically conductive housing.

15. The configuration according to claim 14, wherein said electrical shielding device has an elliptical or round cross section.

16. The configuration according to claim 14, wherein said electrical shielding device has a longitudinal axis which is disposed in a coaxial manner with respect to the first and second conductor tubes, at least in a region of the first and second conductor ends which are opposite one another.

* * * * *